(12) United States Patent
Araki et al.

(10) Patent No.: US 6,444,409 B2
(45) Date of Patent: Sep. 3, 2002

(54) COATING AND DEVELOPING METHOD

(75) Inventors: Shinichiro Araki; Shinko Matsumoto; Noriyuki Anai, all of Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/875,022

(22) Filed: Jun. 7, 2001

Related U.S. Application Data

(62) Division of application No. 09/365,782, filed on Aug. 3, 1999, now Pat. No. 6,270,576.

(30) Foreign Application Priority Data

Aug. 5, 1998 (JP) ............................................ 10-233596

(51) Int. Cl.⁷ .............................. G03F 7/16; G03F 7/20; G03F 7/26; G02B 5/20; G02F 1/1335
(52) U.S. Cl. ............................ 430/325; 430/7; 430/935
(58) Field of Search ............................. 430/325, 7, 935; 118/52; 427/510, 514, 162, 164, 165

(56) References Cited

U.S. PATENT DOCUMENTS

| 5,562,772 A | 10/1996 | Neoh |
| 5,993,081 A | 11/1999 | Itoh et al. |

FOREIGN PATENT DOCUMENTS

| JP | 63-137768 | 6/1988 |

*Primary Examiner*—John A. McPherson
(74) *Attorney, Agent, or Firm*—Rader, Fishman & Grauer, PLLC

(57) ABSTRACT

A coating and developing apparatus for coating a substrate with a plurality of color resists and for developing it after exposure, comprises: a scrubbing unit for scrubbing the substrate; a coating unit having a plurality of resist discharge nozzles for respectively discharging a plurality of color resists on the scrubbed substrate; and a developing unit for developing the substrate coated with the color resists after exposure. Accordingly, reduction in size of apparatus and space savings can be achieved, and manufacturing cost can also be reduced.

8 Claims, 9 Drawing Sheets

COATING AND DEVELOPING METHOD

This application is a division of application Ser. No. 09/365,782, filed Aug. 3, 1999, and now U.S. Pat. No. 6,270,576. The disclosure of the prior application is incorporated herein by reference.

FIELD OF THE INVENTION

The present invention relates to a coating and developing method of resist coating by supplying a resist on the front face of a substrate, exposing it, and thereafter developing it by supplying a developing solution particularly for fabricating a color filter of a color liquid crystal display (LCD) or the like and an apparatus therefor.

BACKGROUND OF THE INVENTION

A color filter of a color liquid crystal display (LCD) is fabricated by the so-called photolithography technology in which a rectangular substrate made of glass is coated with color resists of four colors (red, green, blue, and black), and is exposed and developed.

In the photolithography process of the color filter, coating, exposing and developing are performed for each of the color resists. More specifically, for example, a substrate after being scrubbed is coated with a red color resist, thereafter the red color resist is exposed and is sequentially developed. Next, the substrate after being scrubbed is coated with a green color resist, thereafter the green color resist is exposed and is sequentially developed. Then, similar processes are performed with respect to blue and black.

Accordingly, processing units for scrubbing, coating, exposing and developing are required for processing of each color, the processing units for scrubbing, coating, exposing and developing are continuously arranged, and processes are sequentially performed from upstream to downstream.

However, when one color filter is coated with a plurality of color resists by the coating and developing system as described above, processing units for scrubbing, coating, exposing and developing are required to provide for each of the colors. Moreover, a plurality of groups of processing units for scrubbing, coating, exposing and developing in correspondence with the number of colors must be provided. Therefore, there is a problem in the coating and developing system as described above in that the configuration of the apparatus becomes huge in size, which causes an increase in space occupied in a clean room, and also an increase in manufacturing cost.

The present invention is made in view of the above circumstances. An object of the present invention is to provide a coating and developing method and an apparatus therefor in which reduction in size of apparatus and space savings can be achieved, and manufacturing cost can also be reduced in coating and developing a color filter and the like. Another object is to provide a coating and developing method and an apparatus therefor in which yields of products can be improved.

SUMMARY OF THE INVENTION

To solve the aforesaid problems, the first aspect of the present invention is characterized by steps of coating a substrate with a selected predetermined color resist out of a plurality of kinds of color resists; transferring the substrate coated with the predetermined color resist to an aligner; and developing the exposed substrate received from the aligner, in which after repeats of the above steps in due order, the substrate is housed in a cassette which can house therein a plurality of substrates.

A second aspect of the present invention is characterized by a coating and developing apparatus for coating a substrate with a plurality of color resists and for developing it after exposure, which comprises a resist coating unit having a plurality of resist discharge nozzles for respectively discharging the plurality of color resists to a substrate; and a developing unit for developing the substrate coated with the color resist after exposure.

A third aspect of the present invention is characterized by a coating and developing apparatus comprising a resist coating unit for coating a substrate with a selected predetermined color resist out of a plurality of kinds of color resists; a transfer mechanism for transferring the substrate coated with the predetermined color resist to an aligner and to a developing unit for developing the exposed substrate received from the aligner, in which the resist coating unit includes at least one nozzle for discharging the plurality of kinds of color resists and a cleaning mechanism for cleaning the inside of the nozzle.

A fourth aspect of the present invention is characterized by steps of coating a substrate with a selected predetermined color resist out of a plurality of kinds of color resists; transferring the substrate coated with the predetermined color resist to an aligner; and developing the exposed substrate received from the aligner, in which a coating processing of a plurality of color resists and developing processing after exposure thereof are performed, since the substrate is housed in a cassette which can house therein a plurality of substrates after repeats of the above steps in due order.

Accordingly, in the present invention, a plurality of color resists can be applied one after another and developed them after exposure by one coating and developing apparatus, so that reduction in size of apparatus and space savings can be achieved, and manufacturing cost can also be reduced.

Moreover, in the present invention, a plurality of color resists can be applied with high efficiency by using one resist discharge nozzle to each of a plurality of color resists for discharging the respective resists in the resist coating unit.

Furthermore, the present invention comprises a cleaning mechanism for cleaning the inside of the color resist discharge nozzle, whereby the color resist does not solidify in the nozzle, which can prevent a solidified color resist from being discharged onto a substrate G, resulting in improvements of product yields.

The above and other objects and advantages of the present invention will be easily confirmed from the following detailed description in conjunction with the accompanying drawings.

DETAILED DESCRIPTION OF THE INVENTION

Figure 1A:
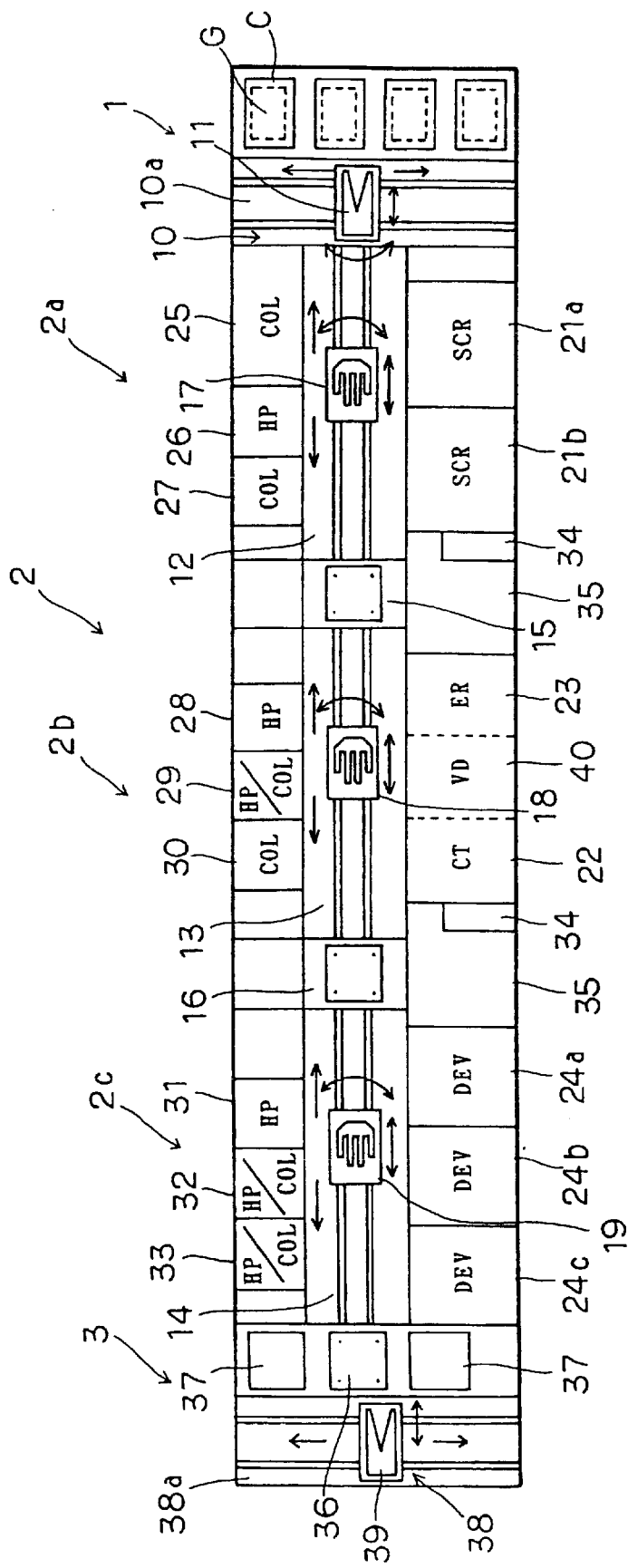
FIG. 1A is a plan view showing a coating and developing system for a color filter of an LCD to which the present invention is applied.

FIG. 1A is a plan view showing a coating and developing system for a color filter of an LCD as an embodiment to which the present invention is applied.

The coating and developing system comprises a cassette station 1 for mounting thereon cassettes C in each of which a plurality of substrates G can be housed, a process section 2 having a plurality of processing units for performing a series of processes including resist-coating and development for the substrate G, and an interface section 3 for sending and receiving the substrate G to/from an aligner (not shown), where the cassette station 1 and the interface section 3 are separately disposed on both sides of the process section 2.

The cassette station 1 includes a transfer means, for example, a transfer mechanism 10 for transferring the substrate G between the cassettes C and the process section 2. The cassettes C are carried in/out at the cassette station 1. The transfer mechanism 10 includes a transferring arm 11 which can move on a transfer path 10a provided along a direction of disposition of the cassettes, and the substrate G is transferred between the cassettes C and the process section 2 by the transferring arm 11.

The process section 2 is divided into a former stage 2a, a middle stage 2b, and a latter stage 2c, which respectively include transfer paths 12, 13, and 14 in the center of the above stages. The respective processing units are arranged on both sides of the above transfer paths. Between the transfer paths, relay sections 15 and 16 are respectively provided for receiving and sending the substrate G between the former stage 2a and the middle stage 2b, and the middle stage 2b and the latter stage 2c.

The former stage 2a includes a transfer means, for example, a main transfer device 17 movable along the transfer path 12 for transferring a substrate. On one side of the transfer path 12, rotary processing units for processing the substrate G while rotating it, for example, two scrubbing units (SCR) 21a and 21b are arranged. On the other side of the transfer path 12, thermal-type processing units for performing thermal processing to the substrate G, for example, a cooling unit (COL) 25, vertically two-tiered heating units (HP) 26 and cooling units (COL) 27, are arranged.

The middle stage 2b includes a transfer means, for example, a main transfer device 18 movable along the transfer path 13 for transferring a substrate. On one side of the transfer path 13, a resist coating unit (COT) 22 for coating the periphery of the substrate G with color resists and an edge processing unit for removing color resists, for example, an edge remover (ER) 23, are arranged. On the other side of the transfer path 13, thermal-type processing units for performing thermal processing to the substrate G, for example, vertically two-tiered heating units (HP) 28, a heating and cooling unit (HP/COL) 29 where a heating unit and a cooling unit are vertically two-tiered, and cooling units (COL) 30, are arranged.

Moreover, in this embodiment, a drying unit 40 is provided between the resist coating unit (COT) 22 and the edge remover (ER) 23. Thereby, the substrate G coated with a color resist is transferred to the drying unit 40 to be dried, and thereafter undergoes edge processing by the edge remover (ER) 23. The drying unit 40 will be described later.

Furthermore, the latter stage 2c includes a transfer means, for example, a main transfer device 19 movable along the transfer path 14 for transferring a substrate. On one side of the transfer path 14, liquid-type processing units for processing the substrate G by supplying a processing liquid and the like, for example, three developing units 24a, 24b, and 24c are arranged. On the other side of the transfer path 14, thermal-type processing units for performing thermal processing to the substrate G, for example, vertically two-tiered heating units 31, two heating and cooling units (HP/COL) 32 and 33 in each of which a heating unit and a cooling unit are vertically two-tiered.

As described above, the process section 2 has a structure where only spinner-type units such as the scrubbing unit 21a, the resist coating unit 22, and the developing unit 24a, are disposed on one side, and only thermal-type processing units such as the heating unit and the cooling unit are disposed on the other side across the transfer paths.

In parts on the side where the spinner-type units are disposed of the relay sections 15 and 16, chemicals supply units 34 are disposed and spaces 35 are additionally provided for the maintenance.

The aforesaid main transfer device 17 has functions of receiving/sending the substrate G from/to the arm 11 of the transfer mechanism 10, and of carrying the substrate G into/out of each unit of the former stage 2a, and moreover, of delivering the substrate G from/to the relay section 15. The main transfer device 18 has functions of receiving/sending the substrate G from/to the relay section 15, and of carrying the substrate G into/out of each unit of the middle stage 2b, and moreover, of delivering the substrate G from/to the relay section 16. Moreover, the main transfer device 19 has functions of receiving/sending the substrate G from/to the relay section 16, and of carrying the substrate G into/out of each unit of the latter stage 2c, and moreover, of delivering the substrate G from/to the interface section 3. The relay sections 15 and 16 also function as cooling plates for temperature regulation means, at which the temperature of the substrate G can be regulated.

The interface section 3 includes an extension 36 for temporarily holding a substrate when delivering the substrate from/to the process section 2, two buffer stages 37 provided on both sides of the extension 36, at which buffer cassettes are disposed, and a transfer means, for example, a transfer mechanism 38 for carrying a substrate, for carrying the substrate G into/out of an external device such as an aligner (not shown) which connects with the extension 36 and the buffer stages 37. The transfer mechanism 38 includes a transferring arm 39 which can move on a transfer path 38a provided along the direction of disposition of the extension 36 and the buffer stages 37, and the substrate G is transferred between the process section 2 and the aligner by the transferring arm 39.

Respective processing units are assembled to be integrated as above, thereby reducing space and improving efficiency of processing.

Figure 1B:
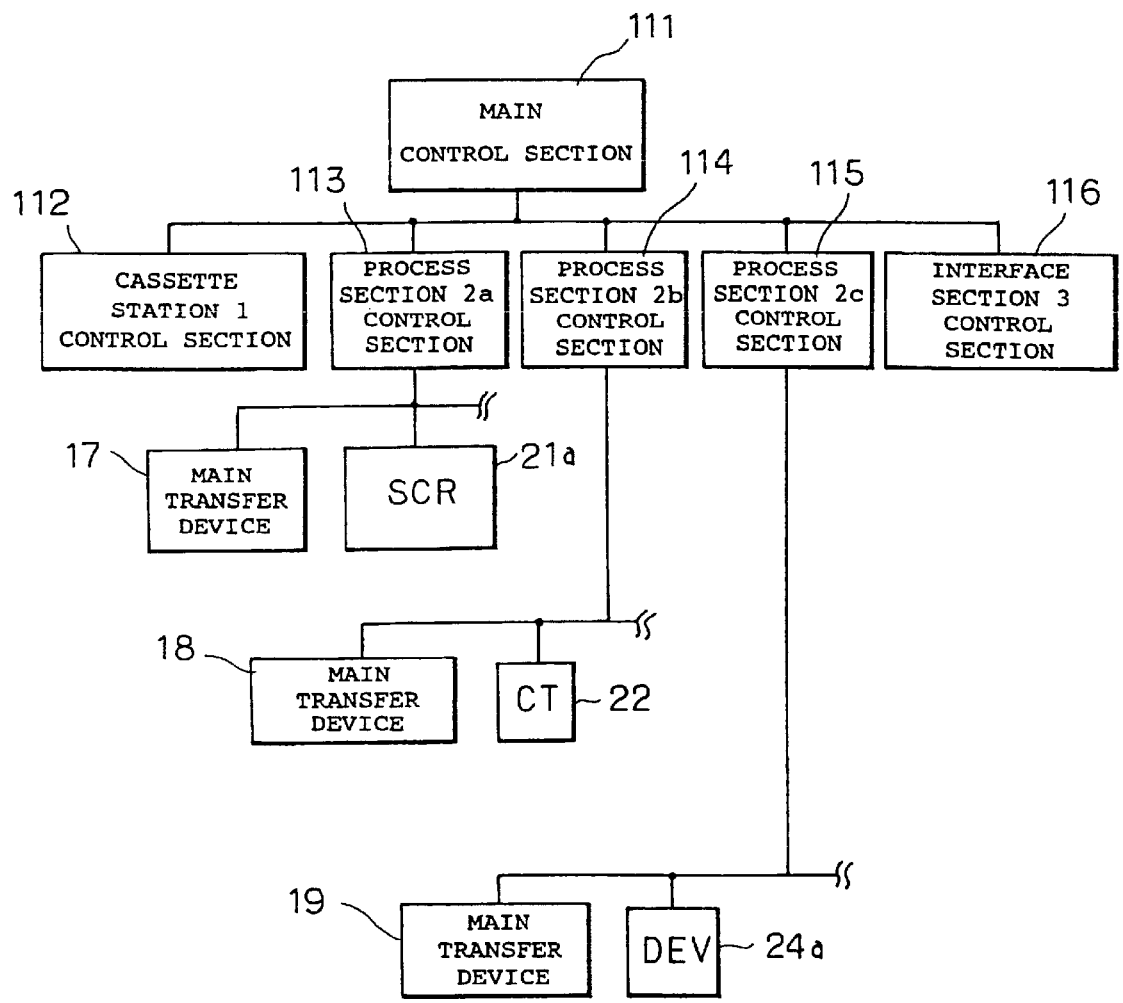
FIG. 1B is an explanatory view explaining a control system of the coating and developing system for a color filter of an LCD.

In the coating and developing system configured as above, the cassette station 1, the process section 2a, the process section 2b, the process section 2c, and the interface section 3, are separately controlled in motion by unit control sections, for example, a control section 112 of the cassette station 1, a control section 113 of the process section 2a, a control section 114 of the process section 2b, a control section 115 of the process section 2c, and a control section 116 of the interface section 3 respectively, and the control sections of respective process sections are centrally controlled by a main control section 111, as shown in FIG. 1B. The processing in each processing mechanism in the cassette station 1, the process section 2a, the process section 2b, the process section 2c, and the interface section 3 is controllable as follows: Recipes are sent from the main control section 111 to the control section 112 of the cassette station 1, the control section 113 of the process section 2a, the control section 114 of the process section 2b, the control section 115 of the process section 2c, and the control section 116 of the interface section 3. Thereby, a substrate coated with one color resist in the resist coating unit 22 is transferred to each processing mechanism, for example, the aligner and the developing units 24a to 24c in order, the substrate G is transferred again to the resist coating unit 22, and the substrate G coated with another color resist in the resist coating unit 22 is transferred to the aligner and the developing units 24a to 24c in order.

In the coating and developing system configured as above, the substrate G in the cassette C is transferred to the process section 2, in which the substrate G is first scrubbed in the scrubbing units (SCR) 21a and 21b of the former stage 2a, and dried by heating in one of the heating units (HP) 26, and thereafter cooled in one of the cooling units (COL) 27.

The substrate G is then transferred to the middle stage 2b and coated with a predetermined color resist in the resist coating unit (COT) 22 (a step of coating a substrate with a color resist), and dried in the drying unit 40, and thereafter an excess color resist on the periphery of the substrate G is removed in the edge remover (ER) 23. Thereafter, the substrate G is prebaked in one of the heating units (HP) in the middle stage 2b and cooled in the cooling unit (COL) at the lower tier in the unit 29 or 30.

Then, the substrate G is transferred from the relay section 16 to the aligner through the interface section 3 by the main transfer device 19 and exposed with a predetermined pattern (a step of transferring the substrate coated with a predetermined color resist to the aligner). Then the substrate G is again carried in through the interface section 3 and developed in any of the developing units (DEV) 24a, 24b, and 24c (a step of developing the exposed substrate received from the aligner). The developed substrate G is postbaked in any of the heating units (HP) of the latter stage 2c and cooled in one of the cooling units (COL).

The above series of processes per color resist is carried out in accordance with the preinstalled recipes. For example, the substrate G for which a series of coating, exposing, and developing of red is completed, is given a separate series of coating, exposing, and developing of green, blue, and black in order. Each color is processed almost in the same way, except for use of a nozzle of a different color in the resist coating unit (COT) 22 as described later. The completed substrate of a color filter is housed in a predetermined cassette on the cassette station 1 by the main transfer devices 19, 18, and 17 and the transfer mechanism 10.

Figure 2:
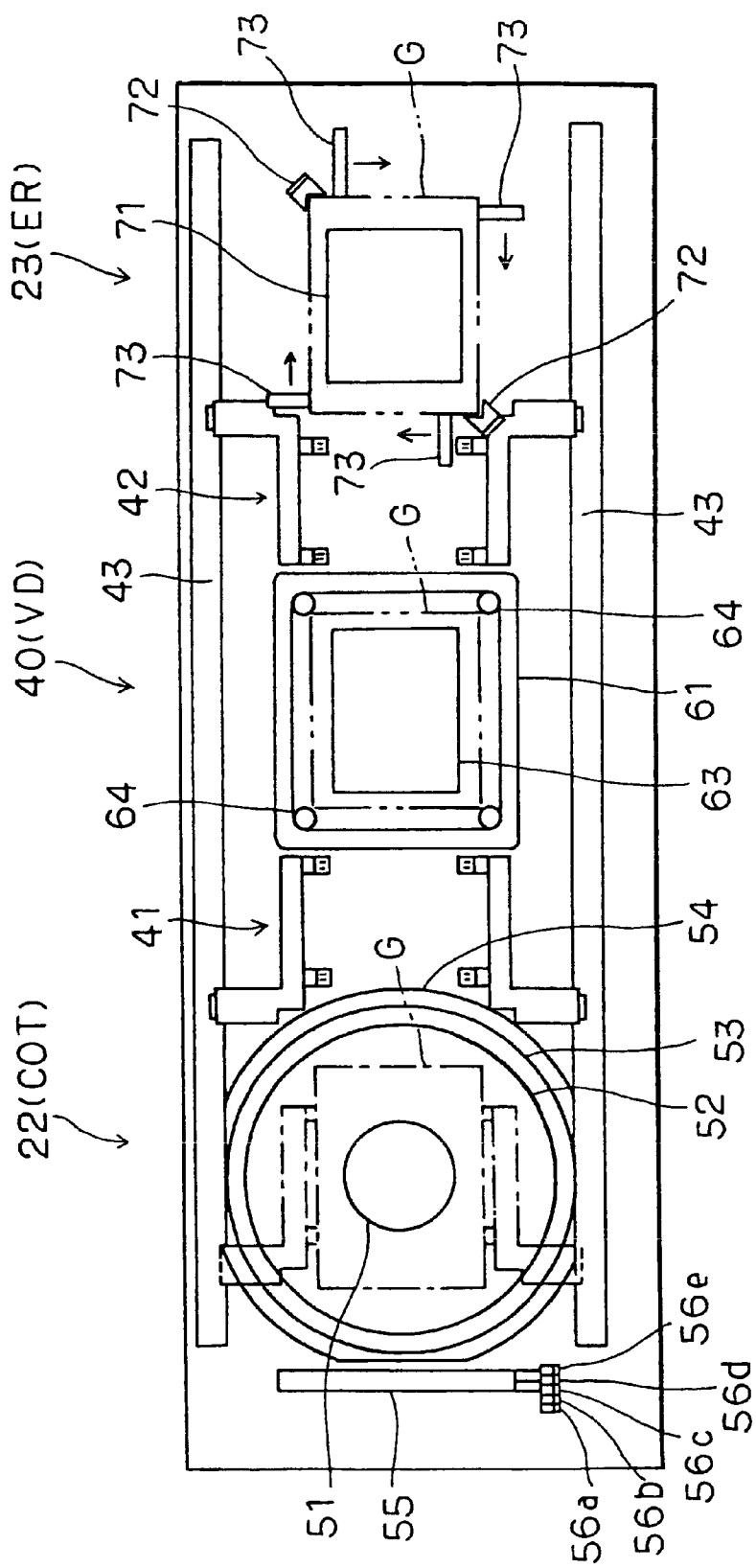
FIG. 2 is a schematic plan view showing a resist coating unit (COT), a drying unit, and an edge remover (ER)
Figure 3A:
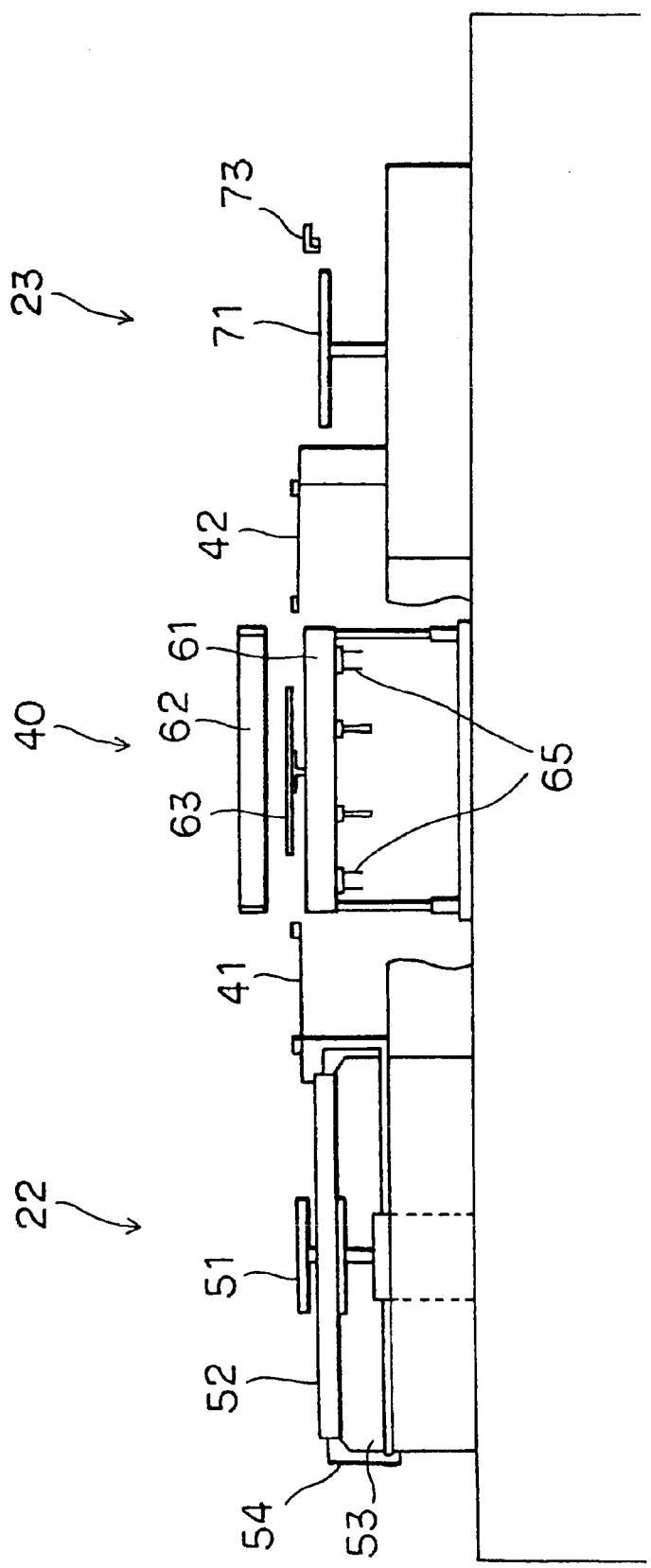
FIG. 3A is a schematic side view showing the resist coating unit (COT), the drying unit, and the edge remover (ER)

Next, the resist coating unit (COT) 22, the drying unit (VD) 40, and the edge remover (ER) 23 which are installed in the coating and developing system for a color filter according to this embodiment, will be described hereinafter. FIG. 2 and FIG. 3A are respectively a schematic plan view and a schematic side view showing the resist coating unit (COT), the drying unit (VD), and the edge remover (ER).

As shown in FIG. 2 and FIG. 3A, the resist coating unit (COT) 22, the drying unit 40, and the edge remover (ER) 23, are integrally placed side by side in a line on the same stage. The substrate G coated with a predetermined color resist in the resist coating unit (COT) is transferred to the drying unit 40 along guide rails 43 by a pair of transferring arms 41. The substrate G dried in the drying unit 40 is transferred to the edge remover (ER) 23 along the guide rails 43 by a pair of transferring arms 42.

The resist coating unit (COT) 22 includes a spin chuck 51 to be horizontally rotatable for suction-holding the substrate G, a rotary cup 52 having a cylindrical form with a bottom and an open top end which is shaped in such a manner to surround the top end part of the spin chuck 51, to surround the substrate G suction-held by the spin chuck 51, and to open at the top end part of itself, a lid body (not shown) which is put on the open top end of the rotary cup 52, and a coater cup 53 secured in such a manner to surround the circumferences of the rotary cup 52. When a color resist is dropped as described later, the substrate G is rotated by the spin chuck 51 in a state where the lid body is opened. When the color resist is diffused, while the substrate G is rotated by the spin chuck 51, the rotary cup 52 in a state where the lid body is closed is rotated. Moreover, around the periphery of the coater cup 53, an outer cover 54 is provided.

The resist coating unit (COT) 22 includes a resist discharge nozzle arm 55 for discharging color resists of four colors (red, green, blue, and black) to a rectangular substrate G made of glass, and the resist discharge nozzle arm 55 is rotatable.

The resist discharge nozzle arm 55 is on standby at a standby position, and is turned to the center of the substrate G when dropping the color resists. At the tip of the resist discharge nozzle arm 55, provided are a nozzle 56a for a red color resist, a nozzle 56b for a green color resist, a nozzle 56c for a blue color resist, a nozzle 56d for a black color resist, and a thinner nozzle 56e. Moreover, a drain pan (not shown) having an open top is fixed under the nozzles 56a to 56e at the standby position.

Figure 3B:
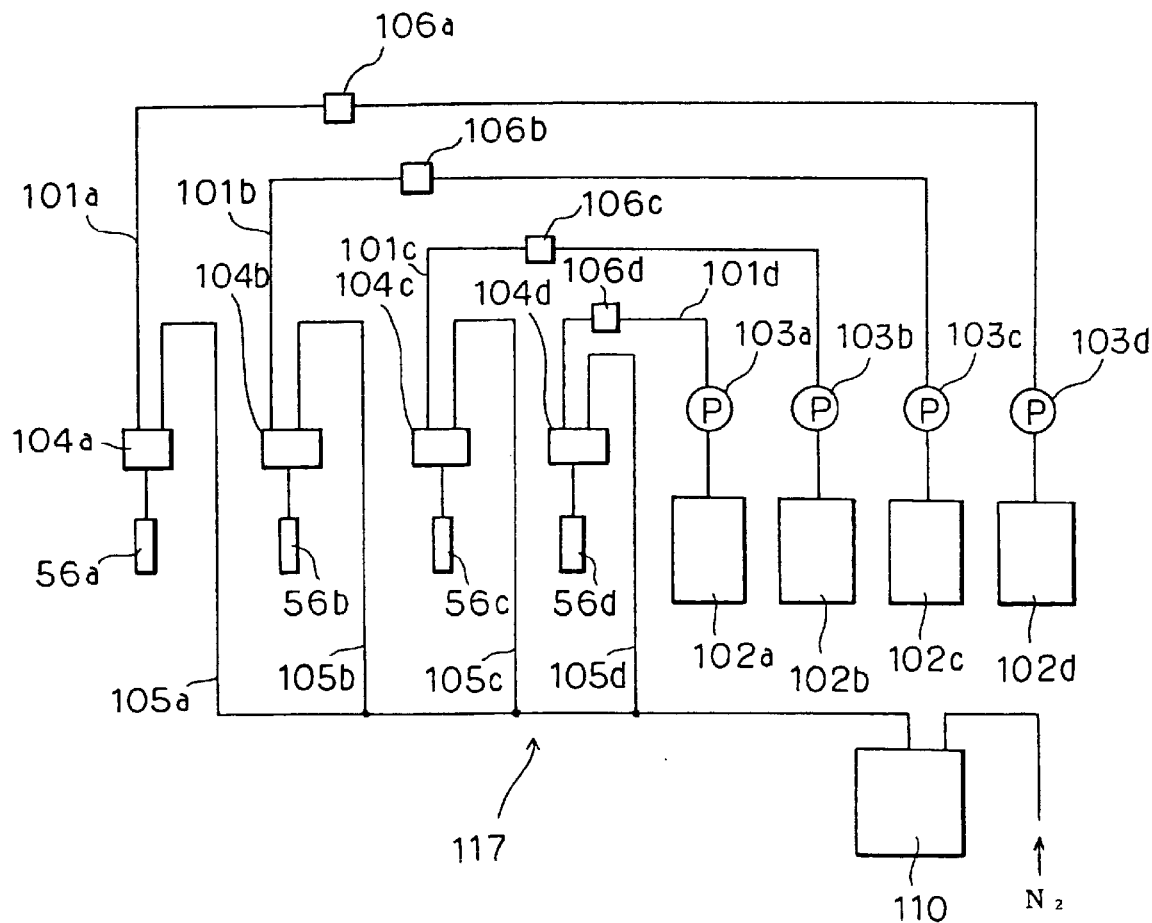
FIG. 3B is an explanatory view of a resist supply mechanism.

As shown in FIG. 3B, respective nozzles 56a to 56d are connected to containers for respectively storing the color resists, for example, resist supply tanks 102a to 102d, through resist supply pipes 101a to 101d, and pumps 103a to 103d are provided at the midpoints thereof. Between the nozzles 56a to 56d and the pumps 103a to 103d, air-operated valves 106a to 106d are provided. Moreover, a nozzle cleaning mechanism 117 for cleaning the inside of each of the nozzles 56a to 56d is provided for each of nozzles 56a to 56d. As the nozzle cleaning mechanisms 117, air-operated three-way valves 104a to 104d are respectively provided between the nozzles 56a to 56d and the pumps 103a to 103d, and are respectively connected with pipes 105a to 105d from a cleaning fluid supply tank 110. One kind of cleaning fluid with which a plurality of kinds of color resists can be dissolved, is stored in the cleaning fluid supply tank 110. The cleaning fluid supply tank 110 can send the cleaning fluid to the pipes 105a to 105d by being pressurized with N2. The air-operated valves 106a to 106d can open and close by a command from a control section 107, and the air-operated three-way valves 104a to 104d can be switched by a command from the control section 107.

For example, when a red color resist is discharged, the air-operated three-way valve 104a is switched to allow the resist to flow from the pipe 101a to the nozzle 56a, then the pump 103a is driven, and the air-operated valve 106a is opened, thereby discharging the resist.

In the above configuration, it is easy that after one color resist is applied to the substrate G by one of the color resist nozzles 56*a* to 56*d*, another nozzle of them performs coating processing. For example, even when the color of a resist applied to the following substrate is different, only changing nozzles can easily cope with that.

Furthermore, for example, after a red color resist is discharged, the inside of the nozzle 56*a* can be cleaned by switching the air-operated three-way valve 104*a* to allow the cleaning fluid to flow from the pipe 105*a* to the nozzle 56*a*. Incidentally, the cleaning fluid after cleaning is discharged from the nozzle 56*a* toward the drain pan (not shown).

Similarly to the above, the nozzles 56*b* to 56*d* can also perform discharging of color resists and cleaning the inside thereof.

The drying unit 40 includes a low chamber 61 and an upper chamber 62 for covering the low chamber 61 to keep the inside of processing chamber airtight. The low chamber 61 is provided with a stage 63 for mounting thereon the substrate G, four exhaust ports 64 are provided in each of corner sections of the low chamber 61, and exhaust ducts 65 (FIG. 3A) communicating with the exhaust ports 64 are connected to an exhaust pump (not shown) such as a turbo-molecular exhaust pump and the like. Thereby, a gas in the processing chamber between the low chamber 61 and the upper chamber 62 is exhausted to reduce pressure down to a predetermined vacuum degree, and the substrate G is dried under a reduced pressure, substantially by non-heating.

The edge remover (ER) 23 (edge processing) is provided with a stage 71 for mounting thereon the substrate G, two alignment means 72 for positioning the substrate G are provided in two corner sections on the stage 71.

On the four sides of the substrate G, provided are four remover heads 73 respectively for removing excess color resists from the edges of the four sides of the substrate G. Each of the remover heads 73 has a nearly U-shaped cross-section so as to discharge thinner from the inside thereof, and can be shifted along each of the four sides of the substrate G by a shifting mechanism (not shown). Accordingly, each remover head 73 can remove excess color resists adhering to each of the four sides of the substrate G, while shifting along each of sides of the substrate G and discharging thinner.

Next, processing of the substrate G in the resist coating unit (COT) 22, the drying unit (VD) 40, and the edge remover (ER) 23 which are integrally structured as above will be described.

First, in the resist coating unit (COT) 22, when the substrate G is rotated by the spin chuck 51, the resist discharge nozzle arm 55 is turned to the center of the substrate G, and the thinner nozzle 56*e* reaches the center of the substrate G, thinner is discharged to the front face of the rotating substrate G and is uniformly spread out from the center of the substrate G and covering entirely the substrate G by centrifugal force.

Sequentially, a nozzle for a predetermined color resist, for example, the nozzle 56*a* for the red color resist reaches a point above the center of the spin chuck 51 (the center of the substrate G), the air-operated three-way valve 104*a* and the air-operated valve 106*a* are controlled, and the red color resist is dropped onto the center of the rotating substrate G to be applied to the substrate G and uniformly spread out from the center of the substrate G entirely to the surroundings by centrifugal force.

After the red color resist is discharged, the resist discharge nozzle arm 55 is turned to the standby position, and performs a process of cleaning the inside of the nozzle 56*a* with the cleaning fluid until the next different color resist is discharged. At this time, the air-operated three-way valve 104*a* is switched to allow the cleaning fluid to flow from the pipe 105*a* to the nozzle 56*a*, and then the cleaning fluid is discharged from the nozzle 56*a* to clean the inside of the nozzle 56*a*. By cleaning the inside of the nozzle 56*a*, the color resist does not solidify inside the nozzle, which can prevent a solidified resist from being discharged onto the front face of the substrate G, resulting in improvements of product yields.

The substrate G coated with the red color resist is transferred to the drying unit 40 by the transferring arm 41, a gas in the chamber between the low chamber 61 and the upper chamber 62 is exhausted, and so the pressure is reduced down to a predetermined vacuum degree. Thereby, a solvent such as thinner and the like in the color resist evaporates to a certain degree and so the solvent in the resist is gradually released, which can accelerate drying of the resist without adversely affecting the resist. Moreover, drying processing is substantially performed by non-heating, which can effectively prevent a transfer onto the substrate G from occurring.

The dried substrate G is transferred to the edge remover (ER) by the transferring arm 42, and the four remover heads 73 are moved along respective sides of the substrate G, thereby excess color resists adhering to the edges of the four sides of the substrate G are removed with discharged thinner. The color resist adhering to the edge of the substrate G is removed, which can reduce the possibility that the color resist adheres to the main transfer devices 17 to 19 and the transfer mechanism 38 when the substrate G is transferred by the main transfer devices 17 to 19 and the transfer mechanism 38, to become a cause of particles.

Thereafter, another substrate G is carried into the resist coating unit (COT) 22, a process of cleaning the inside of the nozzle is completed, the resist discharge nozzle arm 55 is turned, and the same red or another color resist is applied to the substrate G. In a case of the same color, the same operation needs to be performed repeatedly. Even in a case of a different color, the same operation only except that the different color resist is dropped from another color nozzle is required, which can be easily coped with.

Meanwhile, the above substrate G coated with the red color resist is exposed and developed, and after undergoing scrubbing again, carried into the resist coating unit (COT) 22. The second color resist, for example, the green color resist is applied to the substrate from the nozzle 56*b* of the green color resist, and then the aforesaid processes are similarly repeated. The third color resist, for example, blue is applied, and then the fourth color resist, for example, black is applied similarly to the above.

In the resist coating unit (COT) 22, the resist discharge nozzles 56*a* to 56*d* for discharging the respective resists are used in correspondence with a plurality of color resists, so that a plurality of the color resists can be applied with high efficiency.

Next, the developing units (DEV) 24*a*, 24*b*, and 24*c* according to this embodiment will be described hereinafter.

Figure 4:
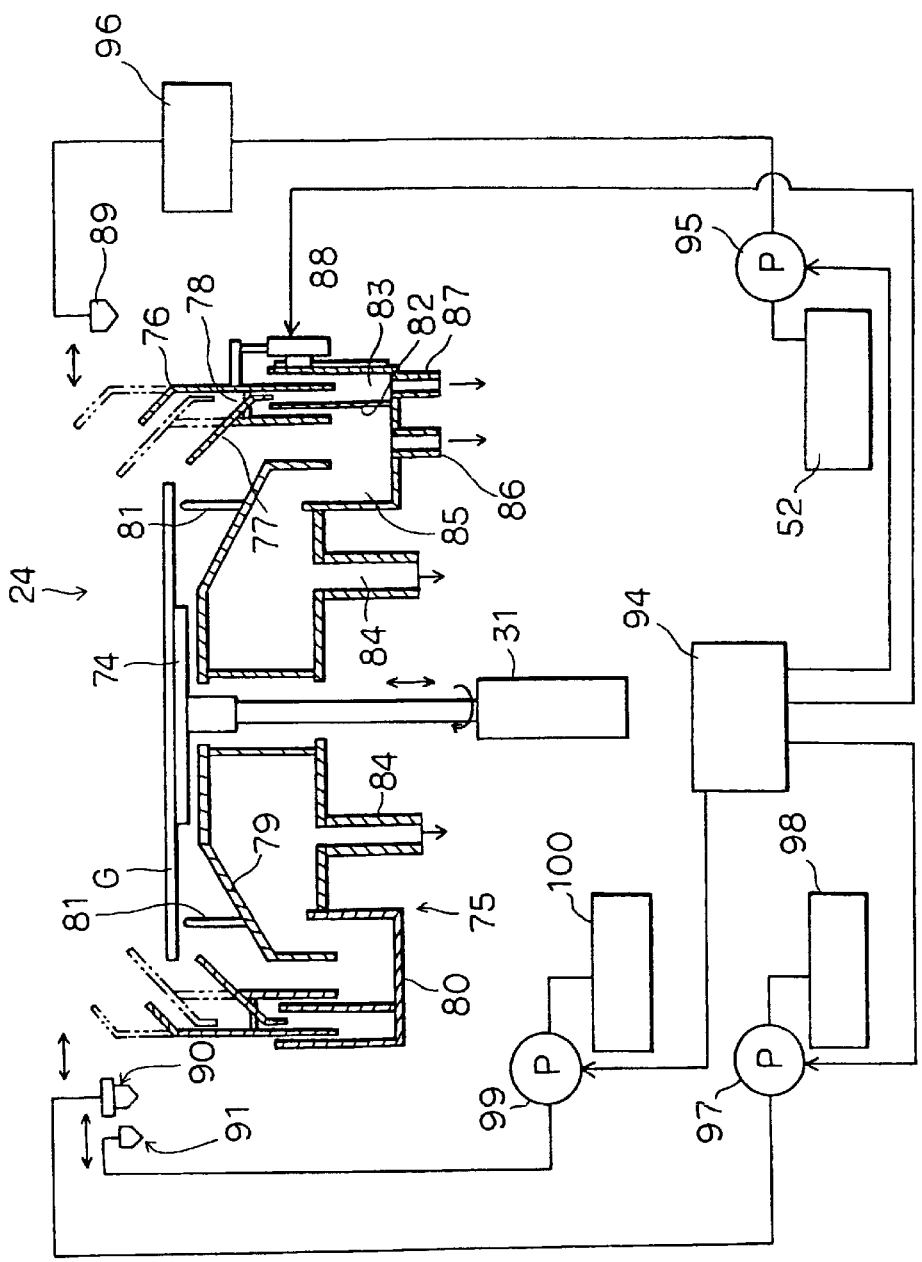
FIG. 4 is a sectional view of a developing unit (DEV)
Figure 5:
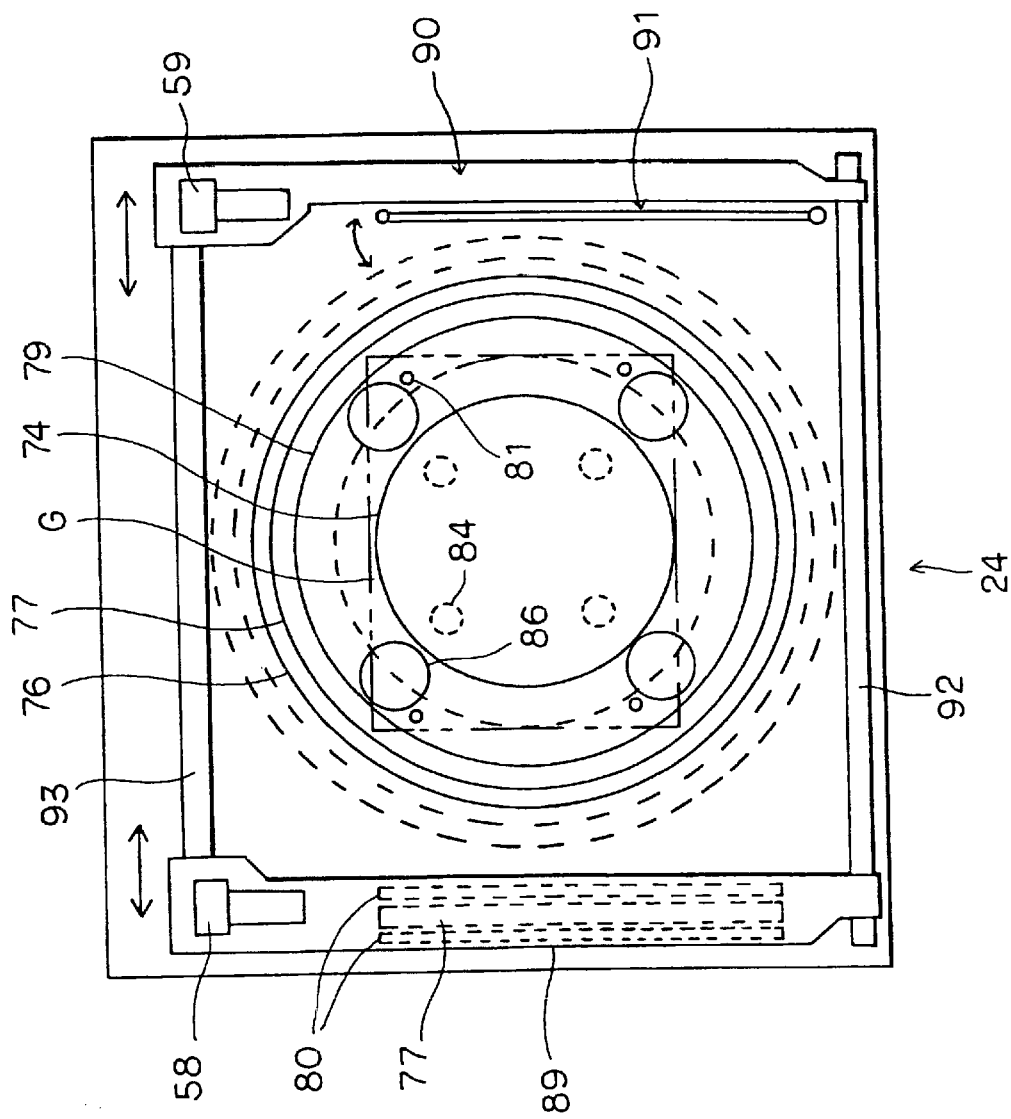
FIG. 5 is a plan view of the developing unit (DEV)

FIG. 4 is a sectional view of the above developing units 24*a*, 24*b*, and 24*c*, and FIG. 5 is a plan view of the same.

As shown in FIG. 4 and FIG. 5, in each central portion of the developing units (DEV) 24*a*, 24*b*, and 24*c*, provided is a spin chuck 74 which can rotate and vertically move by the driving motor 31. The top face of the spin chuck 74 is configured to suction-hold the glass substrate G in a horizontal state by vacuum suction and the like.

A lower container 75 is placed under the spin chuck 74. An outer cup 76 is disposed to surround the periphery of the spin chuck 74, and an inner cup 77 is disposed between the lower container 75 and the outer cup 76.

The outer cup 76 and the inner cup 77 are coupled by a coupling member 78, and ascend and descend by a hoisting and lowering cylinder 88. The outer cup 76 and the inner cup 77 are made in such a manner to incline toward the inside as the upper, the smaller the respective diameters become. The diameter of the open top end of the outer cup 76 is larger than that of the inner cup 77, and both of which are made to have size enough to house the glass substrate G which is descended into the cup while kept in a horizontal state.

The lower container 75 includes an inclined section 79 which inclines downward from the center to the outside, and a pan section 80 disposed around the inclined section 79. On the inclined section 79, a plurality of supporting pins 81 for supporting the rear face of the glass substrate G, for example, four pins are disposed. The vertical position of the tip of the supporting pin 81 is set to be where the tip of the supporting pin 81 abuts the rear face of the glass substrate G when the substrate G supported by the spin chuck 74 is descended to the lowest position. On the bottom of the pan section 80, provided is a cylindrical standing wall 82, which exists between the outer cup 76 and the inner cup 77. The inclined section of the inner cup 77 extends over the standing wall 82 to exist around the periphery of the standing wall 82. Thereby the fluid flowing on the inclined section of the inner cup 77 comes to flow into an outer chamber 83 which is parted by the standing wall 82 of the pan section 80.

On the rear face of the inclined section 79 side of the lower container 75, an exhaust port 84 for exhausting the gas inside the cup is provided, and the exhaust port 84 is connected with an exhaust pump (not shown). A waste liquid port 86 is formed at a lower part of an inner chamber 85 which is parted by the standing wall 82 of the pan section 80, and a drain port 87 is formed at a lower part of the outer chamber 83. The waste liquid port 86 is connected with a collection tank (not shown). The drain port 87 is also connected with a collection tank (not shown).

On one side of the upper part of the cup, a developing solution discharge mechanism 89 for discharging a developing solution to the front face of the glass substrate G is disposed. On the other side, disposed are a high pressure cleaning mechanism 90 for jetting a cleaning fluid out with high pressure to the front face of the glass substrate G, and a rinse fluid supply mechanism 91 for supplying a rinse fluid to the front face of the glass substrate G. Transfer rails 92 and 93 are provided in front of and behind the top part of the cup. The developing solution discharge mechanism 89 and the high pressure cleaning mechanism 90, to which transfer motors 58 and 59 are respectively attached, are transferred to above the inside of the cups along the transfer rails 92 and 93 by driving of the transfer motors 58 and 59 under control of a control section 94.

Into the developing solution discharge mechanism 89, the developing solution is supplied from a developing solution storing tank 52 through a pump 95 under control of the control section 94. The developing solution is one in kind, which is fewer in number than the kinds of the color resists. A warming device 96 for warming the developing solution is laid between the developing solution discharge mechanism 89 and the pump 95. When the temperature of the atmosphere is, for example, 23 (°C.), the warming device 96 warms the developing solution higher in temperature than the atmosphere, for example, 25 (°C.) to 27 (°C.) and keeps it. Thereby the developing speed can be improved. Into the high pressure cleaning mechanism 90, the cleaning fluid is supplied from a cleaning fluid tank 98 through a pump 97 controlled by the control section 94. Similarly, into the rinse fluid supply mechanism 91, a rinse fluid is supplied from a rinse fluid tank 100 through a pump 99 controlled by the control section 94.

Next, operations will be described. The glass substrate G which is carried into the developing units 24a, 24b,and 24c and supported by the spin chuck 74, is descended to a position where the substrate G does not abut the supporting pins 81. The outer cup 76 and the inner cup 77 are ascended to the highest position, and the developing solution discharge mechanism 89 is carried to near the center of the glass substrate G to stop. Then the glass substrate G supported by the spin chuck 74 is rotated, and the developing solution is discharged from the developing solution discharge mechanism 89 to the glass substrate G. The developing solution which scatters from the periphery of the glass substrate G hits the inner side of the inner cup 77 and is collected through the waste liquid port 86, and at least a part of it is reused.

Next, the glass substrate G supported by the spin chuck 74 is descended to a position where the substrate G abuts the supporting pins 81. The outer cup 76 and the inner cup 77 are descended to a predetermined position, for example, the lowest position. The glass substrate G supported by the spin chuck 74 is kept still, the high pressure cleaning mechanism 90 is scanned in the longitudinal direction of the glass substrate G, and the cleaning fluid is discharged from the high pressure discharge mechanism 90 to the glass substrate G. The cleaning fluid which scatters from the periphery of the glass substrate G flows through the space between the inner cup 77 and the outer cup 76 to be drained from the drain port 87. The glass substrate G is supported on its rear face by the supporting pins 81 during high pressure cleaning, which prevents the deformation of the glass substrate G.

Next, the glass substrate G supported by the spin chuck 74 is ascended to a position where the substrate G does not abut the supporting pins 81. The outer cup 76 and the inner cup 77 are kept in a state of being descended to the lowest position, and the rinse fluid supply mechanism 91 is carried to near the center of the glass substrate G. The glass substrate G supported by the spin chuck 74 is rotated, and the rinse fluid is supplied to the substrate G from the rinse fluid supply mechanism 91. The rinse fluid which scatters from the periphery of the glass substrate G flows through the space between the inner cup 77 and the outer cup 76 to be drained from the drain port 87.

Finally, the rinse fluid supply mechanism 91 is carried outside the cup, and the glass substrate G supported by the spin chuck 74 is rotated at high speed to be drained by spinning.

As has been explained, a plurality of color resists can be applied in order, and developed after exposure by one coating and developing system including the scrubbing unit (SCR), the resist coating unit (COT), and the developing unit (DEV). Consequently, reduction in size of apparatus and space savings can be achieved, and manufacturing cost can be also reduced.

It should be noted that the present invention is not limited to the above embodiments, and various modifications can be employed. For example, in the above embodiments, explained is a case where one substrate is coated with a plurality of resists in order, the application of all colors is completed, and thereafter the substrate is returned to the cassette. In addition to that, color resists can be applied by various orders such that the coating of all substrates with one color resist is completed, and then the substrates are returned to the cassette to be coated with the following color in a similar way.

Figure 6:
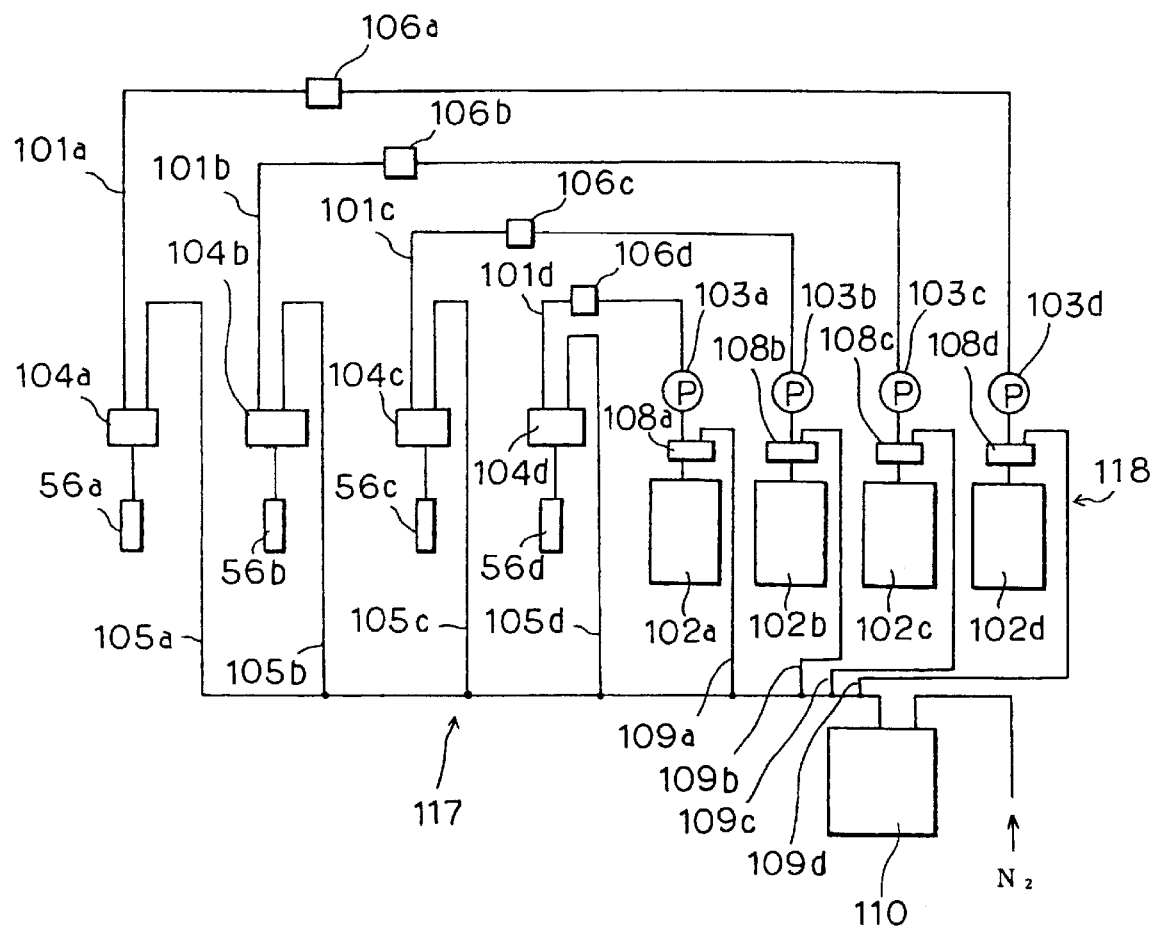
FIG. 6 is an explanatory view of a cleaning mechanism for cleaning the inside of a nozzle for discharging a color resist and a container for storing the color resist.

It is needless to say that, as shown in FIG. 6, tank cleaning mechanisms 118 which can clean vacant resist supply tanks 102a to 102d may be additionally provided to perform a step of cleaning separately or simultaneously the insides of the resist supply tanks 102a to 102d. As the tank cleaning mechanisms 118, air-operated three-way valves 108a to 108d are provided between the pumps 103a to 103d and the resist supply tanks 102a to 102d. Moreover, pipes 109a to 109d for supplying the cleaning fluid from the cleaning fluid supply tank 110 to the air-operated three-way valves 108a to 108d are provided. Hereinafter, a case where the inside of the resist supply tank 102a is cleaned will be explained. When the color resist in the resist supply tank 102a runs out, the air-operated three-way valve 108a is switched to allow the cleaning fluid to flow from the pipe 109a to the resist supply tank 102a, so as to save the cleaning fluid in the resist supply tank 102a, thereby cleaning the inside of the resist supply tank 102a. The resist supply tank 102a is cleaned before being supplied with a new resist, thereby preventing the resist before supply from mixing into the resist after supply, and so the resist before supply is not applied to the substrate, resulting in improvements of product yields. A plurality of the resist supply tanks 102a to 102d can be simultaneously cleaned by switching the air-operated three-way valves 108a to 108d.

After the cleaning fluid is saved in the resist supply tank 102a, the air-operated three-way valve 108a is switched to allow the cleaning fluid to flow from the resist supply tank 102a to the pump 103a, the air-operated three-way valve 104a is switched to permit the cleaning fluid in the resist supply tank 102a to be discharged from the nozzle 56a and the cleaning fluid to flow from the pipe 101a to the nozzle 56a, the air-operated valve 106a is opened, the pump 103a is driven, and the cleaning fluid is discharged from the nozzle 56a, thereby the passage between the resist supply tank 102a to the nozzle 56a is also cleaned. Thereafter, the resist supply tank 102a is supplied with a resist or replaced with a new one. When the resist supply tank 102a is vacant, the passage from the resist supply tank 102a to the nozzle 56a can be also cleaned, so that the resist does not solidify in the passage while being supplied into the resist supply tank 102a, resulting in improvements of product yields.

It is needless to say that any kind of liquids which can remove resist can be employed as the cleaning fluid, and so the resist solvent may be employed. The nozzle is cleaned with the resist solvent, for example, thinner, thereby preventing alien substances from mixing into the resist, resulting in improvements of product yields. Thinner is readily available.

Figure 7:
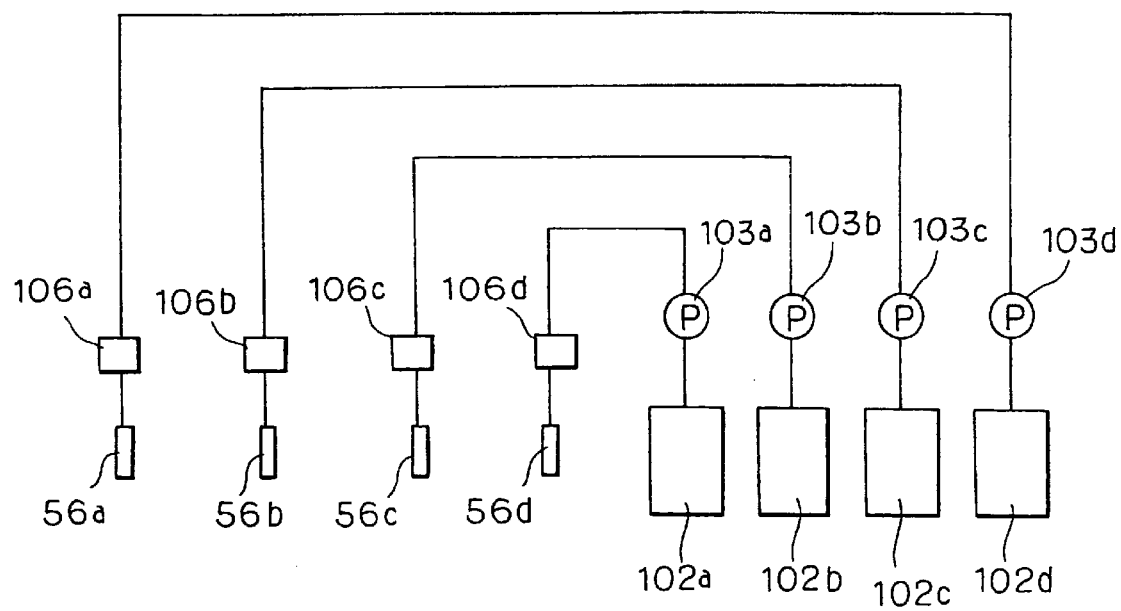
FIG. 7 is an explanatory view of another embodiment of a cleaning mechanism for cleaning the inside of a nozzle for discharging a color resist.

As the nozzle cleaning mechanisms 117, the cleaning fluid supply tank 110 and the air-operated three-way valves 104a to 104d are provided. However, as shown in FIG. 7, the cleaning fluid supply tank 110 and the air-operated three-way valves 104a to 104d are not provided, and the resist supply tanks 102a to 102d may be naturally respectively replaced with the cleaning fluid supply tank 110 and pumps 103a to 103d are driven to clean the inside of the nozzles 56a to 56d when performing the nozzle cleaning. In this case, the apparatus configuration can be simplified and downsizing of the apparatus is possible. The apparatus configuration can be simplified, so that possibility of trouble decreases, resulting in improvements of reliability of the apparatus.

A plurality of the nozzles for discharging color resists are provided, and the number of the nozzles may be one as a matter of course. A predetermined color resist is discharged and then the inside of the nozzle is cleaned, so that the color resist does not remain in the nozzle after cleaning. Even when a different color resist is discharged from the same nozzle after cleaning, the resist before cleaning does not mix into the different color resist. Consequently, further downsizing of the apparatus is possible.

The cleaning of the inside of the nozzles 56a to 56d is naturally performed at regular intervals instead of being performed only when the color resists are discharged. The timing of cleaning can be chosen from the times when the number of discharge of the color resists to the substrate G exceeds a predetermined number, when lots of substrates are finished, and when a predetermined period of time has passed from the last time of discharge of the color resist. In this case, the number of cleaning of nozzles can be reduced, resulting in improvements of throughput.

It is noted that arrangement and the number of units in the coating and developing system are not particularly limited.

The aforesaid embodiments have the intention of clarifying technical meaning of the present invention. Therefore, the present invention is not intended to be limited to the above concrete embodiments or to be interpreted in a narrow sense, and various changes may be made therein without departing from the spirit of the present invention and within the meaning of the claims.

What is claimed is:

1. A method of forming a plurality of kinds of color resist films on a substrate, said method comprising the steps of:
   forming one of said plurality of kinds of color resist films on a substrate, the forming step including a step of coating the substrate with a color resist prepared for forming said one of said plurality of kinds of color resist films and a step of developing the color resist coated on the substrate; and
   repeating the forming step while changing the color resist to be fed onto the substrate, thereby forming said plurality of kinds of color resist films on the substrate,
   wherein each of the coating steps are carried out by using a common resist-coating unit, which is adapted to apply a plurality kind of color resists each prepared for forming said plurality of kinds of color resist films.

2. The method as set forth in claim 1, wherein at least two of the developing steps employ a common developing solution.

3. The method as set forth in claim 2, wherein only one kind of developing solution is used in the developing steps.

4. The method as set forth in claim 1, wherein the resist-coating unit has a nozzle adapted to feed at least one of said plurality kind of color resists onto the substrate,
   said method further comprising a step of cleaning an interior space of the nozzle after feeding at least one of said plurality kind of color resists onto the substrate.

5. The method as set forth in claim 1, wherein the resist-coating unit has a nozzle adapted to feed all of said plurality kind of color resists onto the substrate,
   said method further comprising a step of cleaning an interior space of the nozzle during an interval between two of the coating steps, in which the nozzle feeds different kinds of color resists of said plurality kind of color resist onto the substrate, by using only one kind of cleaning fluid capable of dissolving all of said plurality of kinds of color resists.

6. The method as set forth in claim 5, wherein the resist-coating unit has a plurality of containers adapted to contain said plurality kinds of color resists, said method further comprising the step of cleaning interior spaces of the container by using the cleaning fluid.

7. The method as set forth in claim 1, wherein the substrate is cleaned before each of the coating steps.

8. The method as set forth in claim 1, wherein each of said plurality kind of resists is exposed before each of the developing steps.

* * * * *